United States Patent [19]
Nagata et al.

[11] Patent Number: 5,142,321
[45] Date of Patent: Aug. 25, 1992

[54] IMAGE RECORDING APPARATUS BUILT UP WITH VERSATILE UNIT AND OPTIONAL EXPOSURE UNIT

[75] Inventors: Osamu Nagata, Aichi; Keiji Seo, Nagoya, both of Japan

[73] Assignee: Brother Kogyo Kabushiki Kaisha, Aichi, Japan

[21] Appl. No.: 669,059

[22] Filed: Mar. 14, 1991

[30] Foreign Application Priority Data

Mar. 14, 1990 [JP] Japan ................................ 2-63318

[51] Int. Cl.$^5$ ..................... G03B 27/32; G03B 27/52
[52] U.S. Cl. ........................................................ 355/27
[58] Field of Search ......................... 355/27; 430/138; 354/298, 304

[56] References Cited
U.S. PATENT DOCUMENTS
4,764,792 8/1988 Ducos et al. .......................... 355/27

Primary Examiner—Richard A. Wintercorn
Attorney, Agent, or Firm—Oliff & Berridge

[57] ABSTRACT

In an image recording apparatus of the type using a photosensitive pressure-sensitive recording medium having a surface coated with an immense number of microcapsules encapsulating therein a dye precursor, requisite components of the apparatus excluding an exposure unit are arranged as a single unit to provide a versatile unit. A desired type of the exposure unit is used in conjunction with the versatile unit, whereby different types of image recording apparatuses can be built up, which may be a full-color copying machine, a CRT printer, or a film printer.

8 Claims, 5 Drawing Sheets

IMAGE RECORDING APPARATUS BUILT UP WITH VERSATILE UNIT AND OPTIONAL EXPOSURE UNIT

BACKGROUND OF THE INVENTION

The present invention relates to an image recording apparatus with a desired exposure device mounted thereon as an option.

As an image recording apparatus of the type using a photosensitive pressure-sensitive recording medium carrying thereon an immense number of pressure-rupturable, various kinds of image recording apparatuses have been known in the art which include a full-color copying machine, a CRT printer, a film printer. These machines or devices have been designed to have a relevant handling quality and requisite functions depending on the intended use thereof.

However, notwithstanding the fact that these devices have a basic arrangement common to all these devices, the final arrangements of these devices are considerably different due to a difference in intended use. To design and build up each of the different types of image recording apparatuses, a great deal of time and expense has been required.

SUMMARY OF THE INVENTION

The present invention has been made to solve the above problems, and it is accordingly an object of the present invention to provide a versatile basic arrangement of an image recording apparatus as a single unit which can be commonly used in various types of image recording apparatuses.

It is another object of the present invention to reduce cost for designing and building up the image recording apparatuses.

It is still another object of the present invention to facilitate the maintenance and examination of he image recording apparatuses.

To achieve the above and other objects, there is provided an image recording apparatus having conveying means for conveying a photosensitive pressure-sensitive recording medium, exposing means for exposing the photosensitive pressure-sensitive recording medium to imaging light to form a latent image thereon, feeding means for feeding an image receiving medium, and developing means for developing the latent image on the photosensitive pressure-sensitive recording medium and forming a visible image on the image receiving medium upon applying a pressure to superposed photosensitive pressure-sensitive recording medium and the image receiving medium, wherein the conveying means, the feeding means, and the developing means are arranged as a unit to provide a versatile unit, one of a plurality of exposure units being selectively used in conjunction with the versatile unit.

In the image recording apparatus according to the present invention, one of a plurality of exposure unit is selectively combined with the versatile unit. Each of the exposure units has a capability of exposing the entire exposure zone to imaging light. The recording medium is brought to the exposure zone by the conveying means, where the recording medium is subjected to a slit exposure or a surface exposure. The exposed recording medium is superposed on the image receiving medium being fed by the feeding means and the superposed two media are developed to form a visible image on the image receiving medium.

In this manner, the requisite components for the image recording apparatus are arranged as a single unit with the exception of the exposure means. Therefore, by appropriately selecting an appropriate type of the exposure unit and used in conjunction with the versatile unit, a desired type of the image recording apparatus can easily be built up.

The above and other objects, features and advantages of the present invention will become more apparent from the following description when taken in conjunction with the accompanying drawings in which preferred embodiments of the present invention are shown by way of illustrative examples.

DETAILED DESCRIPTION OF THE PREFERRED EMBODIMENTS

Figure 1A:
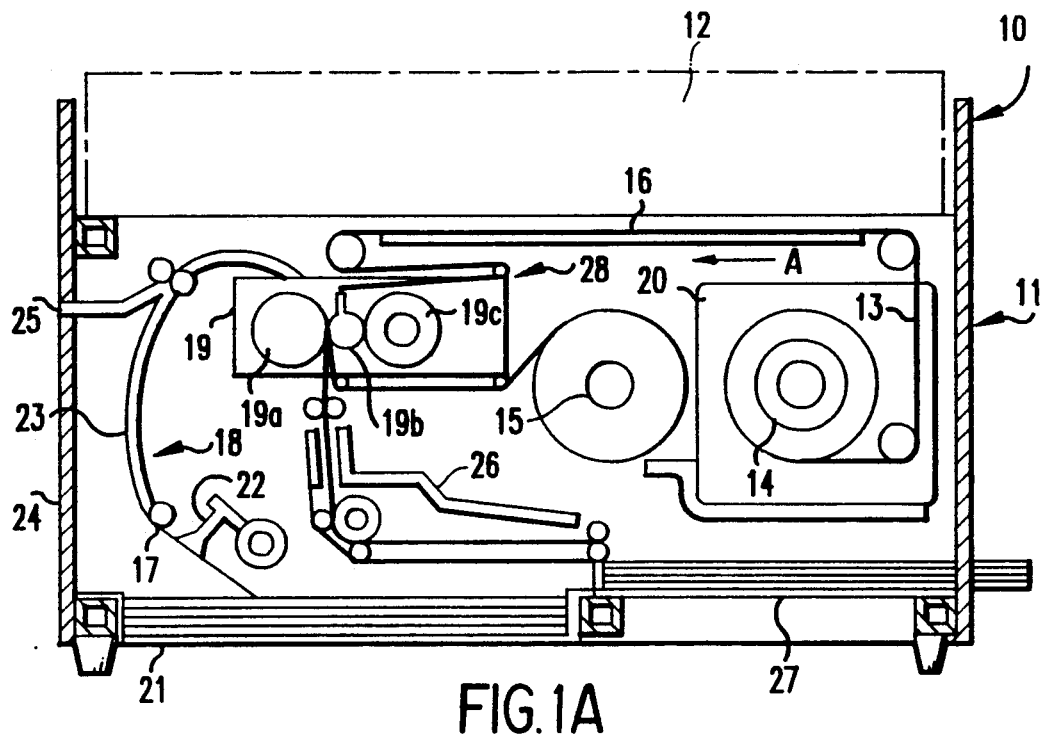
FIG. 1A is a vertical cross-sectional view showing a versatile unit of an image recording apparatus according to the present invention.
Figure 1B:
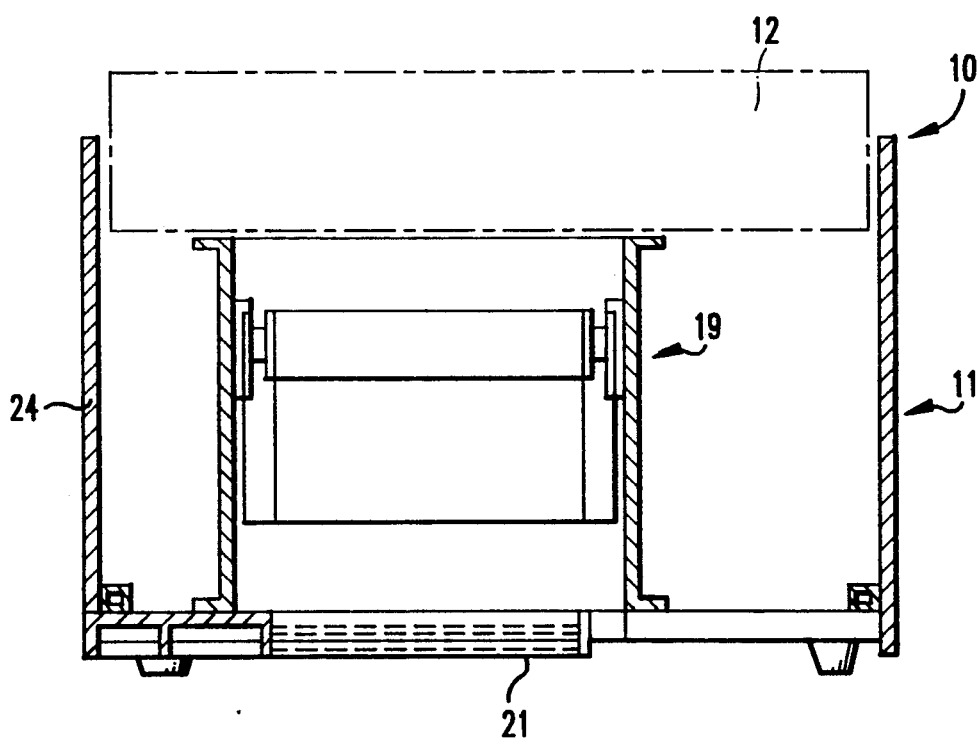
FIG. 1B is a front view of the apparatus shown in FIG. 1A.

FIGS. 1A and 1B show an arrangement of a versatile unit used for processing a photosensitive pressure-sensitive recording medium used in an image recording apparatus. The image recording apparatus 10 is generally made up of a versatile unit 11 and an exposure unit 12, the latter however is not loaded on the apparatus 10 shown therein.

The versatile unit 11 includes a supply roller 14, a takeup roller 15, an exposure table 16, a developer sheet feeding unit 18, and a pressure developing unit 19. Wound around the supply roller 14 is an elongated, web-like recording medium 13 (hereinafter referred to as "microcapsule sheet") having a surface coated with an immense number of pressure-rupturable microcapsules encapsulating therein a dye precursor of one of three primary colors, cyan, magenta, and yellow. The microcapsule sheet 13 withdrawn from the supply roller 14 is extended to pass through a predetermined path and taken up by the takeup roller 15. The exposure table 16 is disposed in the path to support the microcapsule sheet 13 thereon for exposing the same to an imaging light to form a latent image. A developer sheet 17 is fed out by the feeding unit 18 and brought into facial contact with the microcapsule sheet 13 in the pressure developing unit 19 where two sheets are superposed and are applied with pressure to develop the latent image and form a visible image on the developer sheet 17.

The supply roller 14 is accommodated in a cassette 20 which is detachably mounted on the versatile unit 11. The microcapsule sheet 13 wound around the supply roller 14 travels in a direction indicated by an arrow A as the microcapsule sheet 13 is wound up by the takeup roller 15. The microcapsule sheet 13 passes over the exposure table 16 and is subjected to a surface exposure or a slit exposure by means of the exposure unit 12. A buffer unit 28 is horizontally movably disposed in a predetermined position between the exposure table 16 and the pressure developing unit 19. In accordance with the horizontal movement of the buffer unit 28, the exposed microcapsule sheet 13 is moved by a predetermined amount.

In downstream of the exposure table 16 with respect to the moving direction of the microcapsule sheet 13, there is disposed the pressure developing unit 19 which includes a pair of pressurizing rollers 19a and 19b, and a pressure adjusting roller 19c. In the pressure developing unit 19, the exposed microcapsule sheet 13 and the developer sheet 17 supplied by the feeding unit 18 are superposed and are applied with pressure by means of the pressurizing rollers 19a, 19b. The pressure adjusting roller 19c adjusts a pressure applied to the superposed sheets by the rollers 19a, 19b.

The developer sheet feeding unit 18 includes a developer sheet cassette 21 storing a stack of developer sheets 17 thereon, a feedout member 22 having a suction cup at one end for separating the uppermost developer sheet 17 from the remainder and feeding it out, and a conveying path 23 for conveying the developer sheet 17 fed out by the feedout member 22. A manual insertion slot 25 formed in a chassis of the versatile unit 11 is in communication with the conveying path 23, so that the operator can manually insert a developer sheet from the slot 25 into the apparatus.

The versatile unit 11 has a thermal fixing unit 26 for thermally fixing the visible image on the developer sheet 17. The thermal fixing unit 26 includes a heating means such as a heater (not shown), and an air blowing means such as a fan. Heated air is blown against the image-formed face of the developer sheet 17 to thermally fix the image.

The versatile unit 11 further includes a receiving tray 27 for receiving the image-formed developer sheet 17 thereon. The developer sheets 17 which have passed through the thermal fixing unit 26 are discharged in secession onto the receiving tray 27.

The versatile unit 11 has drivers (not shown) for driving the takeup roller 15, the feedout member 22, etc. In FIG. 1B, the apparatus 10 has right and left side spaces for accommodating a driving mechanism, an exposure mechanism, and a control unit. The versatile unit 11 having the above arrangements is formed as a unit defined by the chassis 24.

The exposure unit 12 is detachably mounted above the versatile unit 11. Various types of exposure units 12 can be used depending upon an intended use thereof. For example, the exposure unit 12 may have an exposure device with the use of a cathode ray tube (CRT) or a slide projector. Alternatively, the exposure unit 12 may have an original document scanning device as is provided in a color or monochromatic copying machine.

In the image recording apparatus 10 according to the present invention, a desired type of the exposure unit 12 can be selectively mounted on the versatile unit 11.

Operation of the image recording apparatus 10 will next be described.

The microcapsule sheet 13 on the supply roller 14 is transported at a given speed in the direction indicated by the arrow A as the sheet 13 is wound up by the takeup roller 15. The microcapsule sheet 13 passes over the exposure table 16 where the sheet 13 is subjected to a surface exposure or a slit exposure by the exposure unit 12. On the other hand, the developer sheet 17 has been fed into the pressure developing unit 19 from the sheet cassette 21 or the manual insertion slot 25.

The exposed microcapsule sheet 13 is introduced into the pressure developing unit 19 in accordance with the actuation of the buffer unit 28, where the microcapsule sheet 13 is superposed on the developer sheet 17. The superposed sheets 13, 17 are passed through a nip between the pressurizing rollers 19a, 19b to develop the latent image formed on the microcapsule sheet 13 under pressure and to form a visible image on the developer sheet 17. The pressure imparted by the rollers 19a, 19b have been properly adjusted by the adjusting roller 19c.

The image-formed developer sheet 17 is separated from the microcapsule sheet 13, and the latter is would up by the takeup roller 15 and the developer sheet 17 is introduced into the thermal fixing unit 26 where the image on the developer sheet 17 is thermally fixed. The resultant sheet 17 is then discharged onto the receiving tray 27.

Various embodiments of the image recording apparatus will next be described while referring to FIGS. 2A through 4B.

Figure 2A:
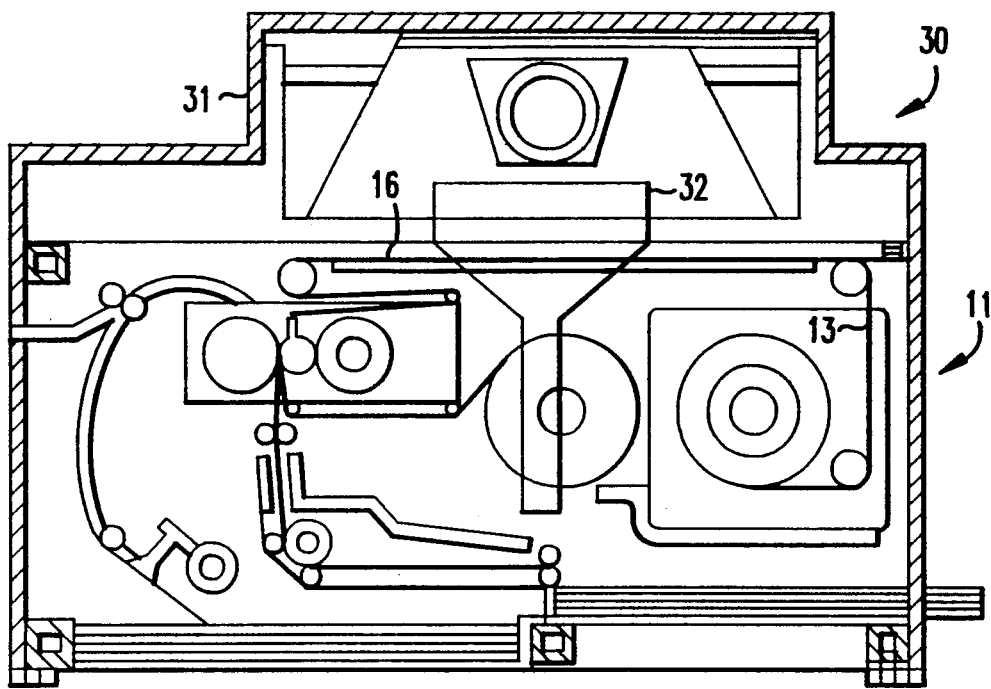
FIG. 2A is a vertical cross-sectional view showing a CRT printer according to one embodiment of the present invention.
Figure 2B:
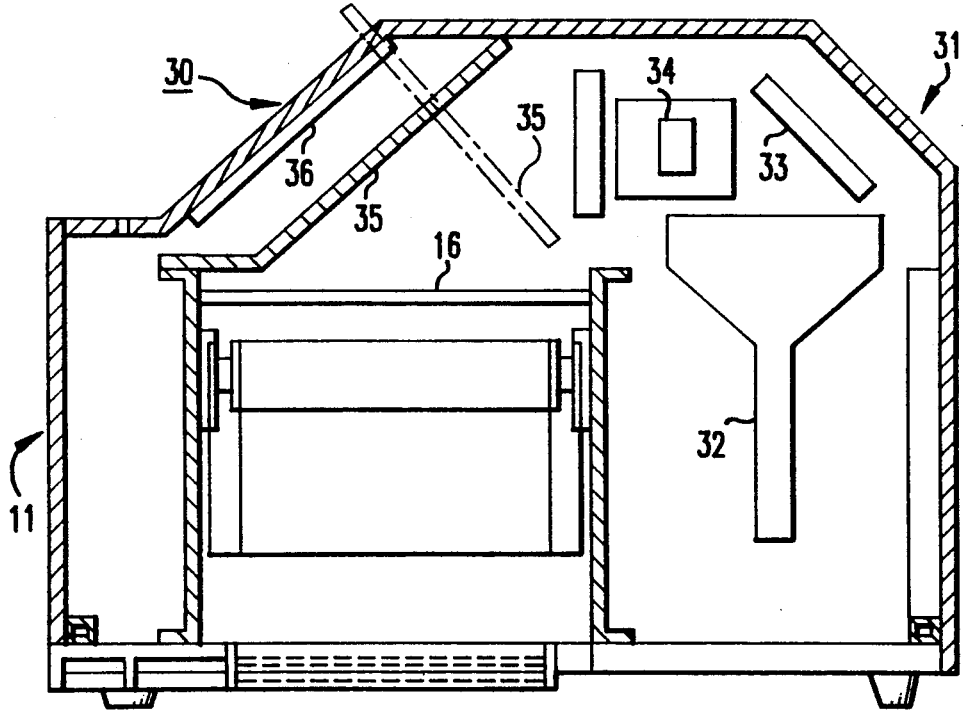
FIG. 2B is a front view of the CRT printer shown in FIG. 2A.

FIGS. 2A and 2B show a CRT printer 30 having an exposure unit in which a CRT is employed. The CRT printer 30 is generally comprised of the versatile unit 11 and a CRT exposure unit 31. As shown in FIG. 2B, a CRT 32 is disposed in the right side space of the apparatus 30. The CRT exposure unit 31 includes a reflection mirror 33, a lens unit 34, and a movable mirror 35. In the CRT printer 30 thus arranged, an image displayed on the CRT 32 is projected onto the exposure table 16 through the reflection mirror 33, the lens unit 34 and the movable mirror 35. Thus, the microcapsule sheet 13 placed on the exposure table 16 is exposed to the projected image to form a latent image thereon. In the versatile unit 11, the image recording is performed using such microcapsule sheet 13.

The CRT printer may be modified in such a manner to attach a projector to an option attachment plate 36 to use the CRT printer as an optional printer enabling to use a slide projector or a LCD (liquid crystal display) projector in lieu of the CRT. In such cases, the movable mirror 35 is oriented to a position indicated by a two-dotted chain line in FIG. 2B so that the image projected from the optional projector is directed onto the exposure table 16 to expose the microcapsule sheet 13.

Figure 3A:
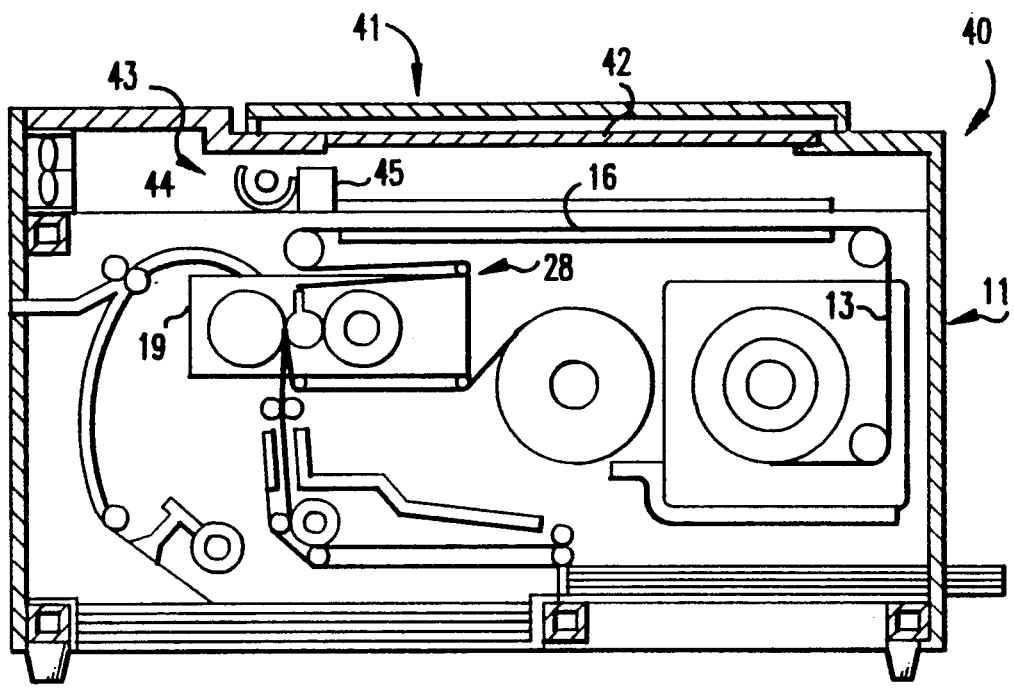
FIG. 3A is a vertical cross-sectional view showing a copying machine having an equi-magnification function according to another embodiment of the present invention.
Figure 3B:
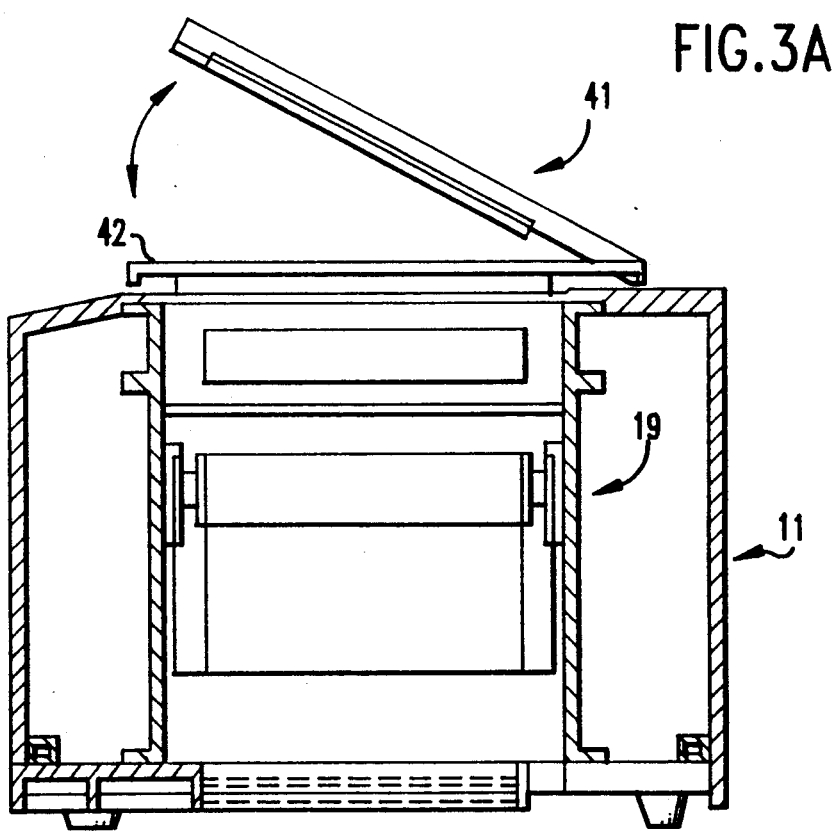
FIG. 3B is a front view of the copying machine shown in FIG. 3A.

Referring next to FIGS. 3A and 3B, a copying machine will be described for making copies of equi-magnification. The copying machine 40 is also generally comprised of the versatile unit 11 and an original document scanning unit 41. The scanning unit 41 is disposed above the versatile unit 11, which unit 41 includes an original support pane 42 and a lens array unit 43 disposed between the original support pane 42 and the exposure table 16. The lens array unit 43 includes a light source 44 and a self-focusing lens array 45.

Operation of the copying machine 40 will be described with respect to the case where the microcapsule sheet 13 is subjected to a slit exposure with an arrangement in which an original support pane 42 is fixed.

As the lens array unit 43 moves in the rightward direction in FIG. 3A, the light emitted from the light source 43 is irradiated onto an original document placed on the original support pane 41. The light reflected therefrom passes through the self-focusing lens array 44 and focused on the exposure table 16. That is, in accordance with the movement of the lens array unit 43, the slit exposure is taken place on the microcapsule sheet 13 placed on the exposure table 16. When the lens array unit 43 returns to the original position, the buffer unit 28 moves rightwardly in FIG. 3A to thereby pull the microcapsule sheet 13 out of the exposure table 16 and to place unexposed microcapsule sheet 13 on the exposure table 16 for subsequent exposure. On the other hand, independently of the subsequent exposure, the exposed microcapsule sheet 13 which has been pulled by the buffer unit 28 is introduced into the pressure developing unit 19 in accordance with the leftward movement of the buffer 28 in FIG. 3A. Therefore, continuous copying can be accomplished. The arrangement of the scanning unit 41 may be modified so that the original support pane 42 is moved while fixedly disposing the lens array unit 43.

Figure 4A:
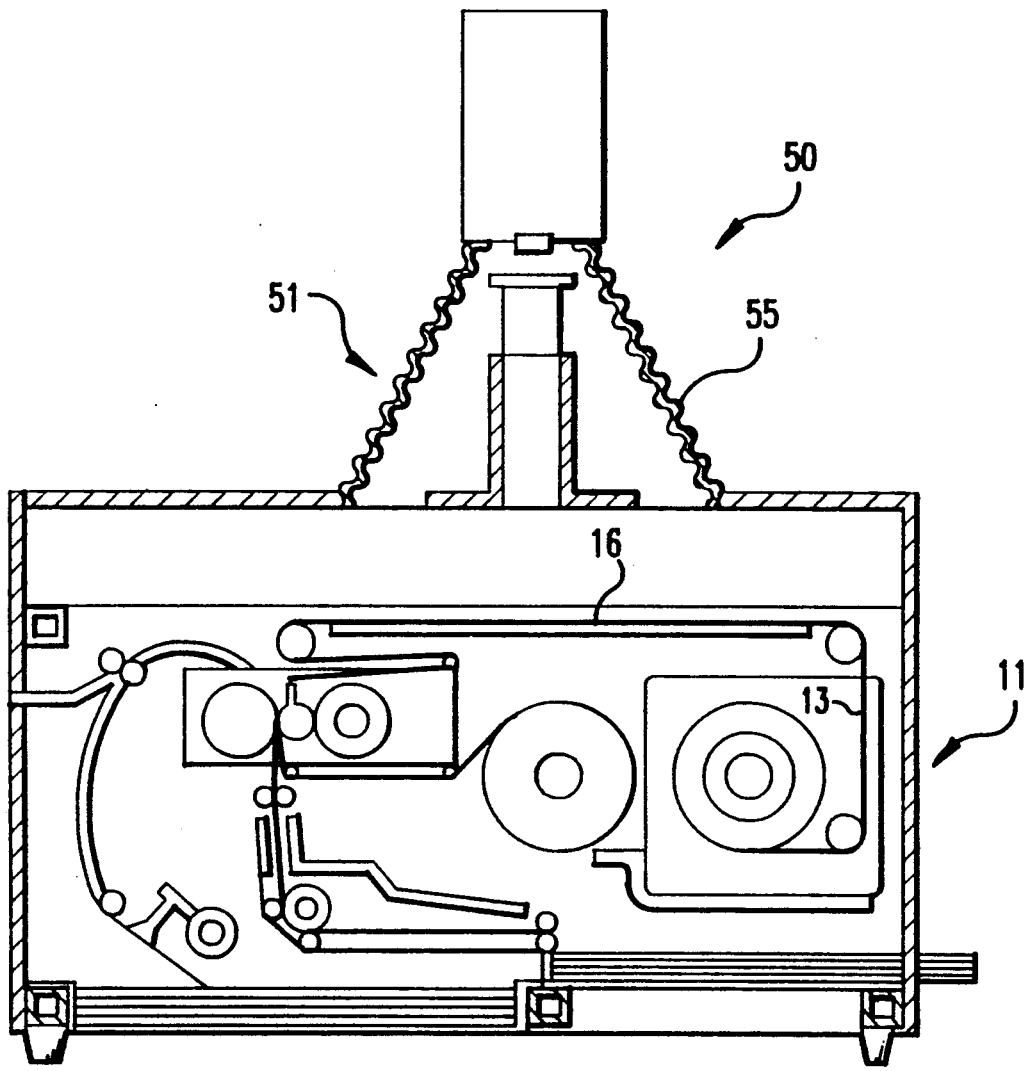
FIG. 4A is a vertical cross-sectional view showing a film printer according to still another embodiment of the present invention.
Figure 4B:
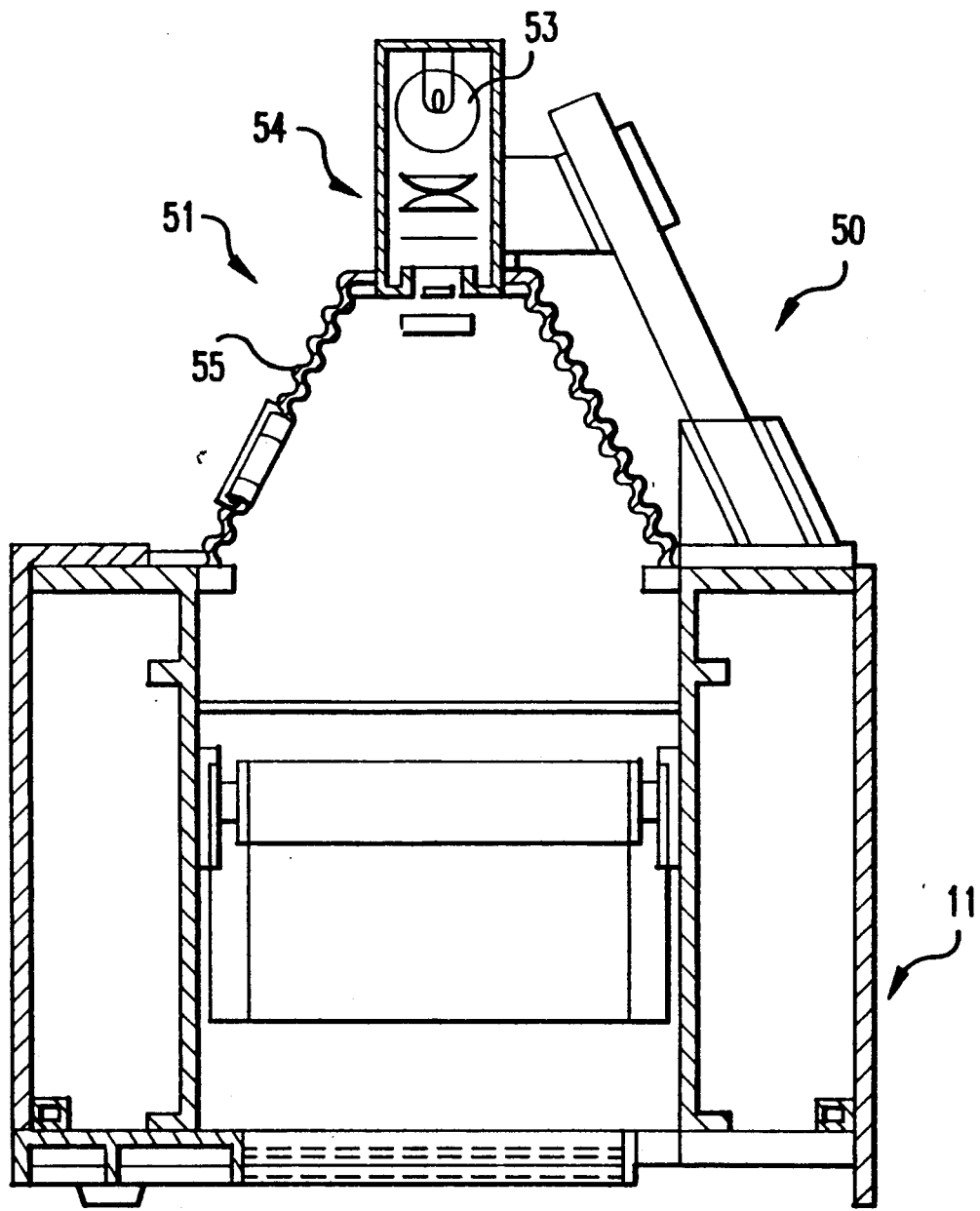
FIG. 4B is a front view of the film printer shown in FIG. 4A.

Lastly, referring to FIGS. 4A and 4B, a film printer 50 will be described in which an enlarger 51 is incorporated in the exposure unit.

The film printer 50 is generally comprised of a commercially available enlarger 51 mounted above the versatile unit 11. As shown in FIG. 4B, the enlarger 51 includes a light source 53 for projecting an image of a film onto the entire surface of the exposure table 16, a lens unit 54, and a shading member 55 for interrupting external light. Such a film printer 50 can be used as a negative film printer as well as a positive film printer with the use of a relevant type of microcapsule sheet 13.

As described, according to the present invention, various types of exposure units can be selectively used in conjunction with the versatile unit 11, whereby different types of printers and copying machines can be readily build up. With the replacement of the exposure unit, the apparatus can be used in different mode.

As is apparent from the foregoing description, the present invention is advantageous in that since the versatile unit 11 can be used in conjunction with selective one of exposure units, a particular type of the image recording apparatus can readily be built up by mounting the selected exposure unit on the versatile unit. The present invention is further advantageous in that it is less costly in designing and manufacturing the apparatus and in addition the maintenance and examination of the apparatus can easily be performed.

What is claimed is:

1. In an image recording apparatus having conveying means for conveying a photosensitive pressure-sensitive recording medium, exposing means for exposing the photosensitive pressure-sensitive recording medium to imaging light to form a latent image thereon, feeding means for feeding an image receiving medium, and developing means for developing the latent image on the photosensitive pressure-sensitive recording medium and forming a visible image on the image receiving medium upon applying a pressure to superposed photosensitive pressure-sensitive recording medium and the image receiving medium, the improvement wherein said conveying means, said feeding means, and said developing means are arranged as a unit to provide a versatile unit, one of a plurality of exposure units being selectively used in conjunction with said versatile unit.

2. An image recording apparatus according to claim 1, wherein the exposure unit is detachably mounted on said versatile unit.

3. An image recording apparatus according to claim 2, wherein an exposure unit includes a cathode ray tube for displaying an image, and means for projecting the image on the photosensitive pressure-sensitive recording medium placed in a predetermined position, the image recording apparatus functioning as a CRT printer when the exposure unit is used in conjunction with said versatile unit.

4. An image recording apparatus according to claim 3, wherein the exposure unit further includes a slide projector for projecting an image of a slide film, and means for directing the image onto the photosensitive pressure-sensitive recording medium placed in a predetermined position, and wherein said slide projector and said cathode ray tube can be selectively used.

5. An image recording apparatus according to claim 3, wherein the exposure unit further includes a liquid crystal display for displaying an image, and means for directing the image onto the photosensitive pressure-sensitive recording medium placed in a predetermined position, and wherein said liquid crystal display and said cathode ray tube can be selectively used.

6. An image recording apparatus according to claim 3, wherein an exposure unit includes original document scanning means for scanning an original document and producing imaging light, and means for directing the imaging light on the photosensitive pressure-sensitive recording medium placed in a predetermined position, the image recording apparatus functioning as a copying machine when the exposure unit is used in conjunction with said versatile unit.

7. An image recording apparatus according to claim 3, wherein an exposure unit includes a film enlarger for producing an enlarged image of a film onto the photosensitive pressure-sensitive recording medium placed in a predetermined position, the image recording apparatus functioning as a film printer when the exposure unit is used in conjunction with said versatile unit.

8. An image recording apparatus according to claim 1, wherein the photosensitive pressure-sensitive recording medium has a surface coated with an immense number of pressure-rupturable microcapsules encapsulating therein a dye precursor.

* * * * *